(12) United States Patent
Yaegashi

(10) Patent No.: US 7,638,832 B2
(45) Date of Patent: Dec. 29, 2009

(54) SEMICONDUCTOR MEMORY DEVICE AND MANUFACTURING METHOD THEREOF

(75) Inventor: Toshitake Yaegashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 11/833,564

(22) Filed: Aug. 3, 2007

(65) Prior Publication Data

US 2007/0272972 A1    Nov. 29, 2007

Related U.S. Application Data

(63) Continuation of application No. 11/319,743, filed on Dec. 29, 2005.

(30) Foreign Application Priority Data

Sep. 9, 2005   (JP) ............................. 2005-262262

(51) Int. Cl.
*H01L 29/788* (2006.01)
*H01L 21/336* (2006.01)

(52) U.S. Cl. .............. 257/314; 257/E29.3; 257/E21.68; 438/257

(58) Field of Classification Search ................. 257/213, 257/288, 314, 315, 316, E29.3–E29.309, 257/E21.68–E21.694; 438/142, 197, 257, 438/288
See application file for complete search history.

(56) References Cited

U.S. PATENT DOCUMENTS 6,534,424 B2 * 3/2003 Fu et al. ..................... 438/791

| | | | |
|---|---|---|---|
| 7,078,813 B2 * | 7/2006 | Sakuma et al. | 257/758 |
| 2002/0081796 A1 * | 6/2002 | Han et al. | 438/211 |
| 2005/0167741 A1 * | 8/2005 | Divakaruni et al. | 257/328 |
| 2007/0272972 A1 | 11/2007 | Yaegashi | |

FOREIGN PATENT DOCUMENTS

| | | |
|---|---|---|
| JP | 9-36358 | 2/1997 |
| JP | 2002-231835 | 8/2002 |
| JP | 2003-347511 | 12/2003 |
| JP | 2004-128505 | 4/2004 |
| JP | 2004-241780 | 8/2004 |
| JP | 2005-116970 | 4/2005 |
| JP | 2005-123524 | 5/2005 |
| KR | 2001-0065796 A | 7/2001 |

OTHER PUBLICATIONS

U.S. Appl. No. 12/117,231, filed May 8, 2008, Nagano.

* cited by examiner

*Primary Examiner*—Sue Purvis
*Assistant Examiner*—Kevin Quinto
(74) *Attorney, Agent, or Firm*—Oblon, Spivak, McClelland, Maier & Neustadt, L.L.P.

(57) ABSTRACT

A semiconductor device, in which both a reduction in a resistivity of a gate electrode and stabilization of transistor characteristics is achieved, and a manufacturing method thereof are disclosed. According to one aspect of the present invention, it is provided a semiconductor device comprising a semiconductor substrate, a plurality of gate electrodes each including an electric charge storage layer formed on the semiconductor substrate through a first insulator, first and second conductor layers, and a second insulator disposed between the electric charge storage layer and the first conductor layer, a barrier insulator provided between the gate electrodes and being in contact with side surfaces alone of the gate electrodes, and an interlayer insulator provided in contact with an upper surface of the second conductor layer.

13 Claims, 11 Drawing Sheets

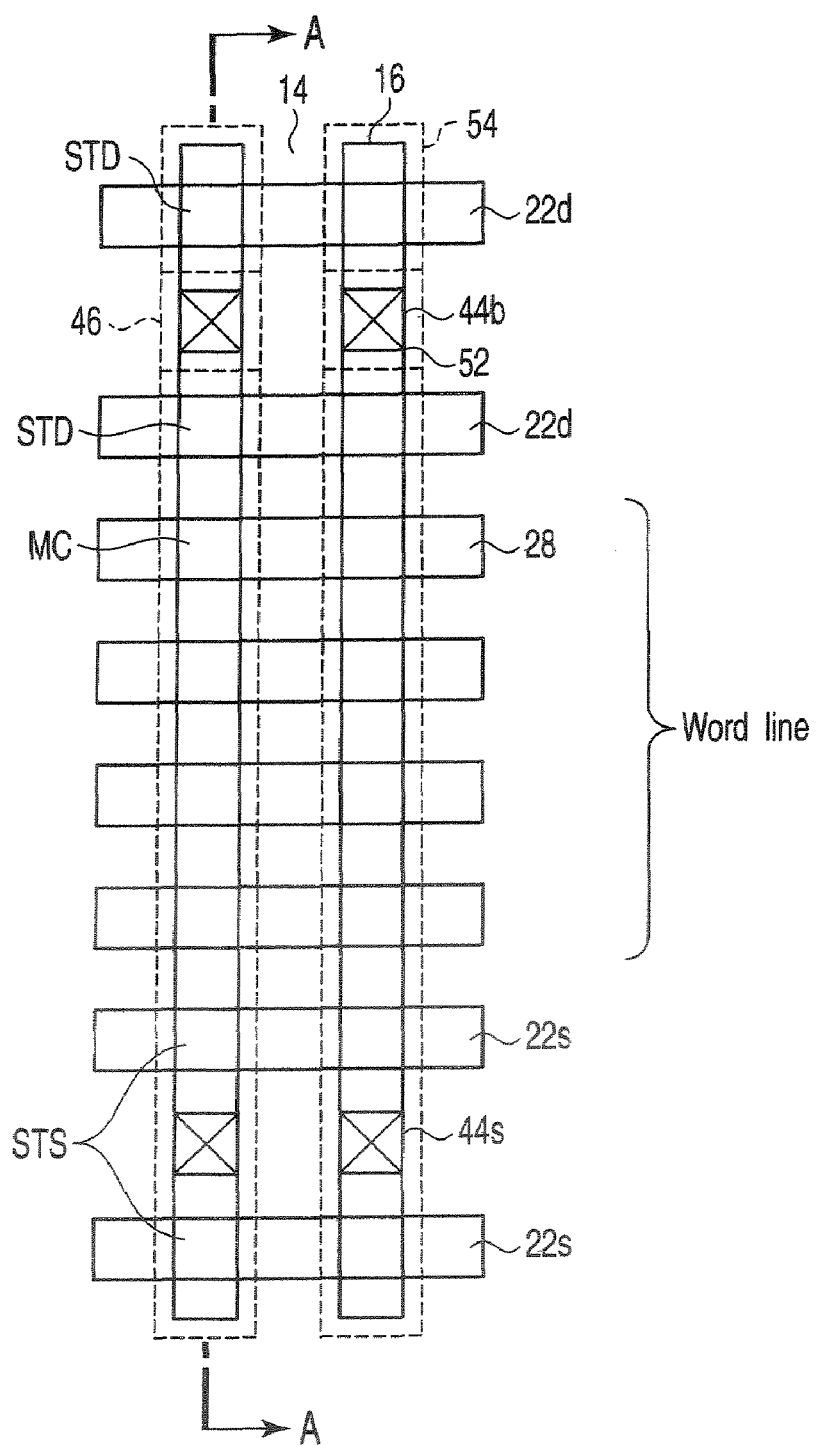
F I G. 1

SEMICONDUCTOR MEMORY DEVICE AND MANUFACTURING METHOD THEREOF

CROSS-REFERENCE TO RELATED APPLICATIONS

This application is a continuation of and claims the benefit of priority under 35 U.S.C. §120 from U.S. Ser. No. 11/319,743, filed Dec. 29, 2005, and claims the benefit of priority under 35 U.S.C. §119 from Japanese Patent Application No. 2005-262262, filed Sep. 9, 2005, the entire contents of which are incorporated herein by reference.

BACKGROUND OF THE INVENTION

1. Field of the Invention

The present invention relates to a semiconductor device and a manufacturing method thereof, and more particularly to a semiconductor device comprising a non-volatile storage element and a manufacturing method thereof.

2. Description of the Related Art

In a semiconductor device comprising a non-volatile storage element, if hydrogen or the like penetrates into an insulator of a capacitor after memory cells are formed, characteristics of the memory cells can be deteriorated. For example, hydrogen penetrated into a gate insulator of a memory cell transistor forms trap sites for electric charges. If electrons are trapped in the trap sites or electrons are released from the traps, then characteristics of the memory cell transistor fluctuate. In order to avoid such fluctuation, there is a technology which covers the memory cell transistor with a hydrogen barrier insulator.

With progress in miniaturization of a semiconductor device, it has been demanded to reduce resistivity of a silicide layer formed in an upper part of a gate electrode in order to achieve further miniaturization and higher speed operation of the semiconductor device. In general, the hydrogen barrier insulator is formed to cover the memory cell transistor after forming the silicide layer. Jpn. Pat. Appln. KOKAI Publication No. 2004-241780 discloses an example of a semiconductor device having such a configuration. In the configuration, a memory cell transistor having tungsten silicide (WSi) layer on the top of the gate electrode is covered with a stress buffering oxide film, and a space between adjacent memory cell transistors is filled with a spacer film (e.g., silicon nitride ($Si_3N_4$) film). After etching-back the spacer film, entire memory cells including an upper surface of the etched back spacer film are covered with an etching stopper film (e.g., $Si_3N_4$ film). The etching stopper film also has a function as a hydrogen barrier insulator. More specifically, the hydrogen barrier insulator is formed above the gate electrode without contacting with the silicide layer formed in the top of the gate electrode.

Silicide having a lower resistivity, e.g., cobalt silicide (CoSi) is apt to be deteriorated during a high-temperature heat treatment as compared with a conventional silicide material, e.g., WSi. If the hydrogen barrier insulator, e.g., $Si_3N_4$ film, is formed after forming CoSi, then CoSi tends to aggregate during a high-temperature CVD process for forming the $Si_3N_4$ film, thereby resulting in a problem such as an increase in a resistivity or disconnection of the silicide layer in an extreme case.

BRIEF SUMMARY OF THE INVENTION

According to one aspect of the present invention, it is provided a semiconductor device comprising: a semiconductor substrate; a plurality of gate electrodes each including an electric charge storage layer formed on the semiconductor substrate through a first insulator, first and second conductor layers, and a second insulator disposed between the electric charge storage layer and the first conductor layer; a barrier insulator provided between the gate electrodes and being in contact with side surfaces alone of the gate electrodes; and an interlayer insulator provided in contact with an upper surface of the second conductor layer.

According to another aspect of the present invention, it is provided a semiconductor device comprising: a plurality of memory cells formed on a semiconductor substrate, electrically connected in series, and each comprising a first gate electrode including first and second conductor layers, the second conductor layer being provided in an upper part of the first gate electrode; first and second selecting transistors provided at either end of the plurality of memory cells, electrically connected with the memory cells in series, and each comprising a second gate electrode including first and second conductor layers, the second conductor layer being provided in an upper part of the second gate electrode; a first contact region provided in the semiconductor substrate on outer side of the second gate electrode of the first selecting transistor; a second contact region provided in the semiconductor substrate on outer side of the second gate electrode of the second selecting transistor; a first contact electrode connected with the first contact region; a second contact electrode connected with the second contact region; a barrier insulator being in contact with side surfaces alone of the first and second gate electrodes and the first and second contact electrodes; an interlayer insulator provided in contact with an upper surface of the second conductor layer; a first wiring connected with the first contact electrode; and a second wiring connected with the second contact electrode.

According to still another aspect of the present invention, it is provided a manufacturing method of a semiconductor device, comprising: forming an electric charge storage layer on a semiconductor substrate through a first insulator; forming a first conductor layer on the electric charge storage layer through a second insulator to form a plurality of gate electrodes; forming a barrier insulator between the gate electrodes, the barrier insulator being in contact with side surfaces alone of the gate electrodes; forming a second conductor layer in an upper part of the conductor layer; and forming an interlayer insulator coming into contact with an upper surface of the second conductor layer.

According to still another aspect of the present invention, it is provided a manufacturing method of a semiconductor device, comprising: forming a first conductor layer on a semiconductor substrate through a gate insulator to form first gate electrodes of first and second selecting transistors; forming an electric charge storage layer on the semiconductor substrate through a first insulator; forming a second conductor layer on the electric charge storage layer through a second insulator to form a plurality of second gate electrodes of memory cells, the memory cells being arranged between the first and second selecting transistors; forming source/drain regions in a plurality of regions of the semiconductor substrate between the first and second gate electrodes of the first and second selecting transistors and the memory cells, the source/drain regions electrically connecting the first and second selecting transistors and the memory cells in series; forming a first or second contact region in the semiconductor substrate in the opposite side of the source/drain region with respect to first gate electrode of the first or second selecting transistor; depositing a third insulator between the first and second gate electrodes; removing a part of the third insulator to expose at least a part of side surfaces of the first and second gate electrodes; forming a barrier insulator on the third insulator and the exposed surfaces of the first and second gate electrodes; removing the barrier insulator on an upper surface of the first and second gate electrodes; forming a third conductor layer in an upper part of the first and second conductor layer; forming an interlayer insulator coming into contact with an upper surface of the third conductor layer; forming an electrode through the third insulator, the barrier insulator and the interlayer insulator and connected with the contact region; and forming a wiring connected with the electrode.

BRIEF DESCRIPTION OF THE SEVERAL VIEWS OF THE DRAWING

FIG. 1 is a plan view illustrating an example of a semiconductor device according to a first embodiment of the present invention;

DETAILED DESCRIPTION OF THE INVENTION

Figure 2:
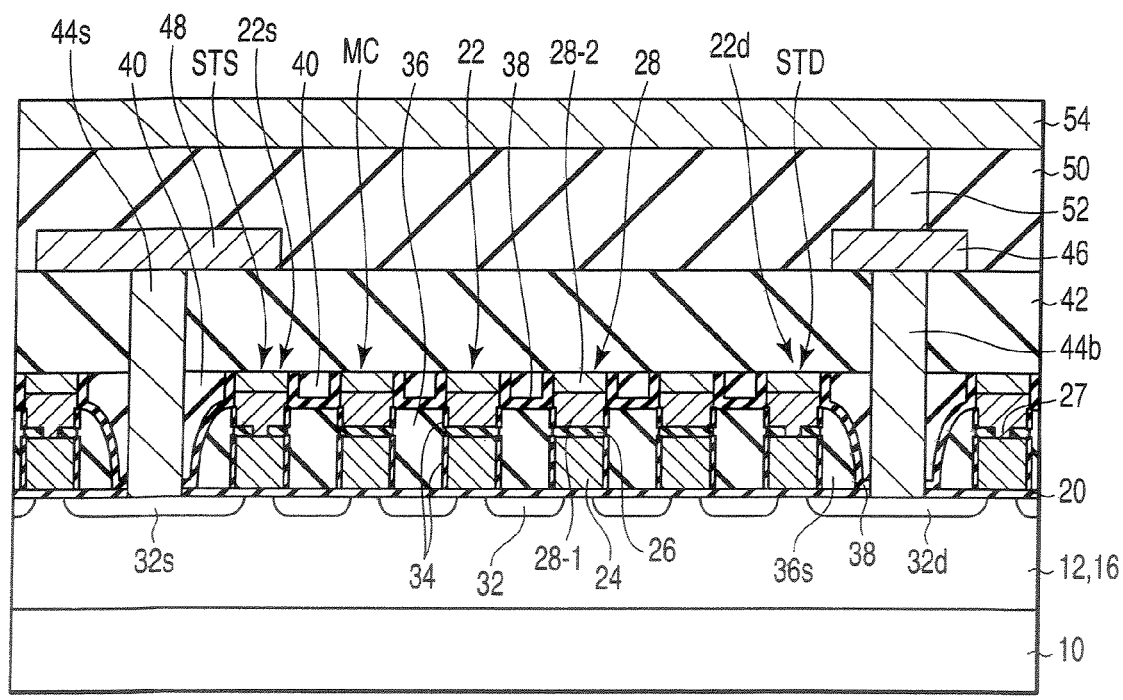
FIG. 2 is a cross-sectional view in a bit line direction illustrating an example of the semiconductor device according to the first embodiment of the present invention taken along a cutting-plane line A-A in FIG. 1.

The embodiments of the present invention will be described with reference to the accompanying drawings. Throughout the drawings, corresponding portions are denoted by corresponding reference numerals. Each of the following embodiments is illustrated as one example, and therefore the present invention can be variously modified and implemented without departing from the spirits of the present invention.

One embodiment of the present invention provides a semiconductor device comprising a hydrogen barrier insulator which is disposed only between gate electrodes but not above the gate electrode and is provided in contact with side surfaces alone of the gate electrode having a silicide layer formed therein, and a manufacturing method of the semiconductor device. In one embodiment of such a semiconductor device, the hydrogen barrier insulator can be formed before forming the second conductor layer (the silicide layer), and a high-temperature heat treatment after the silicide layer formation can be reduced. As a result, it can be provided a semiconductor device and a manufacturing method thereof which comprises a silicide layer capable of achieving a lower resistivity without deteriorating characteristics of a transistor and increasing a resistivity of the gate electrode.

Some embodiments of the present invention will now be described in detail hereinafter taking a non-volatile semiconductor storage device as an example.

First Embodiment

A first embodiment according to the present invention provides a semiconductor storage device and a manufacturing method thereof, in which a lower part of a space between gate electrodes is filled with an inter-electrode insulator while leaving an upper part of the gate electrodes is exposed and a U-like shaped hydrogen barrier insulator is provided on the inter-electrode insulator. The hydrogen barrier insulator comes into contact with side surfaces alone of each gate electrodes.

An NAND type non-volatile semiconductor storage device according to the embodiment will now be described with reference to FIGS. 1 and 2. FIG. 1 is a plan view illustrating NAND type memory cells of a semiconductor device according to the embodiment. FIG. 2 is a cross-sectional view in a bit line direction of a memory cell array according to the embodiment take along a cutting-plane line A-A in FIG. 1. An NAND type memory cell array extending in a vertical direction in FIG. 1 comprises: a plurality of (four in the drawing) memory cells MC connected in series; a drain side selecting transistor STD connected with one end (an upper end in the drawing) of these memory cells MC; and a source side selecting transistor STS connected with the other end of the same. Each memory cell array is formed on an active region 16 of a semiconductor substrate separated by an isolation 14. The memory cells MC of adjacent memory cell arrays arranged in a horizontal direction in the drawing are connected with each other through a control gate electrode 28 extending in the horizontal direction. The control gate electrode 28 serves as a word line. Likewise, the drain side selecting transistors STD or source side selecting transistors STS arranged in the horizontal direction are connected with each other through common drain side selective gate line 22d or source side selective gate line 22s, respectively. The drain side selecting transistor STD is connected with a second wiring (a bit line) 54 through a diffused bits line contact 32d, a bit line contact electrode 44b, a bit line connection pad 46 and an inter-wiring contact electrode 52. The source side selecting transistor STS is connected with a first wiring (a source line) 48 through a diffused source line contact 32s and a source line contact electrode 44s.

The each memory cell arrays are connected with each other in a bit line direction (the vertical direction in FIG. 1) through a bit line 54 and also connected with each other in a word line direction (the horizontal direction in FIG. 1) through a source line 48.

Although FIG. 1 shows that each memory cell array includes four memory cells MC, an NAND type memory cell array can include any number of memory cells MC.

Referring to FIG. 2, the memory cell array is formed on a well 12 provided in a semiconductor substrate 10, e.g., a silicon substrate. In the memory cell array, each memory cell MC, the drain side selecting transistor STD and the source side selecting transistor STS are connected with each other in the bit line direction through a source/drain region 32 formed in the silicon substrate 10.

The memory cell MC includes a gate insulator 20 formed on the silicon substrate 10 and a memory cell gate electrode 22 provided on the gate insulator 20. The memory cell gate electrode 22 includes an electric charge storage layer 24 serving as a floating gate electrode, an inter-polycrystal silicon insulator (referred as inter-polysilicon insulator, hereafter) 26 formed on the electric charge storage layer 24, and a control gate electrode 28 formed on the inter-polysilicon insulator 26. The control gate electrode 28 can have a laminated configuration of first and second conductor layers 28-1 and 28-2, e.g., a polysilicon layer 28-1 and a low resistivity silicide layer 28-2, such as cobalt silicide. The control gate electrode 28 connects with memory cells MC in other memory cell arrays arranged in a word line direction (a direction vertical to a page space of FIG. 2), and thereby serves as a word line.

The gate electrodes 22d and 22s of the drain side and source side selecting transistors STD and STS formed at the respective ends of the memory cell array have a configuration similar to that of the memory cell gate electrode 22, but the floating gate electrode 24 and the control gate electrode 28 are connected with each other through an connecting portion 27 formed by removing a part of the inter-polysilicon insulator 26.

Spaces among the gate electrodes 22, 22d and 22s of each memory cell transistor MC and the drain side and source side selecting transistors STD and STS are filled with a second insulator 36 which is an inter-electrode insulator except an upper part of the control gate electrode 28. A third insulator 38 having an U-like shape which serves as a hydrogen barrier insulator is formed on the second insulator 36 between the gate electrodes 22. Although the third insulator 38 directly comes into contact with side surfaces alone of the control gate electrode 28, it is not provided on an upper surface of the control gate electrode 28, e.g., an upper surface of the second conductor layer 28-2 of silicide.

Further, a fourth insulator 40 is formed on the third insulator 38 between the gate electrodes 22, 22d, 22s, and first and second interlayer insulators 42 and 50 are formed to cover an entire structure.

The diffused bit line contact 32d of the drain side selecting transistor STD is connected with the second wiring 54 serving as a bit line through the bit line contact electrode 44b, the bit line connection pad 46 and the inter-wiring contact electrode 52 provided in the fourth insulator 40 and the first and second interlayer insulators 42 and 50. The diffused source line contact 32s of the source side selecting transistor STS is connected with the first wiring 48 as a source line through the source line contact electrode 44s provided in the fourth insulator 40 and the first interlayer insulator 42.

With such a configuration, the third insulator 38 having hydrogen barrier properties can be formed before forming the second conductor layer (the silicide layer) 28-2, thereby reducing a high-temperature heat treatment after forming the silicide layer. Specifically, as a second conductor layer, it can be used a material, e.g., cobalt silicide (CoSi), which has a low resistivity but is not stable in a high temperature treatment. As a result, delay in the wiring can be suppressed without increasing the resistivity of the control gate electrode 28. Furthermore, by forming the third insulator 38 having hydrogen barrier properties in contact with side surfaces of the gate electrode 22, it can be prevented hydrogen from diffusing into the gate insulator 20 through the space between the memory cell gate electrodes 22. As a result, characteristics of the memory cell transistor MC can be prevented from deterioration being affected by hydrogen.

Therefore, it can be provided a semiconductor device in which the silicide layer 28-2 is used in the control gate electrode 28 without being deteriorated in characteristics of the transistor and increasing a resistivity, and a manufacturing method thereof.

An example of a manufacturing method of the NAND type semiconductor storage device according to the embodiment will now be described in detail with reference to process cross-sectional views in the bit line direction depicted in FIGS. 3A to 3H.

(1) First, a material for forming a gate electrode is being deposited on a semiconductor substrate formed wells and isolations therein.

Figure 3A:
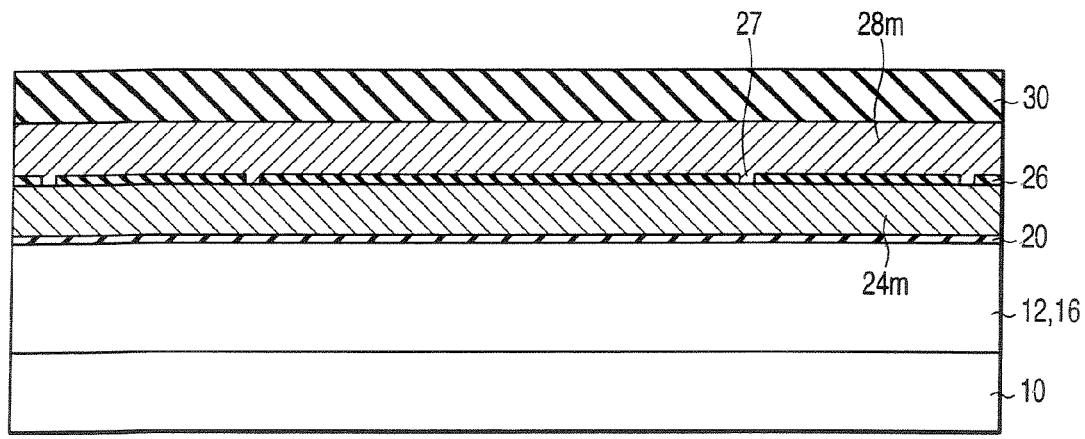
FIGS. 3A to 3H are cross-sectional views illustrating an example of a manufacturing process of the semiconductor device according to the first embodiment.

Referring to FIG. 3A, the well 12 and isolation (not shown) are formed in the semiconductor substrate 10, e.g., a silicon substrate. In the embodiment, the well 12 is of a p-type but it can be of an n-type. For the isolation, it can be used shallow trench isolation (STI), local oxidation of silicon (LOCOS) or any other isolation technology.

Then, a gate insulator 20 and a first conductor film 24m are formed on an entire surface of the silicon substrate 10 including an active region 16 isolated by the isolation. An inter-polysilicon insulator 26, a second conductor film 28m and the first insulator 30 are sequentially formed on the first conductor film 24m. The gate insulator 20 serves as a tunnel oxide of the memory cell transistor, and it can be used, e.g., a silicon oxide film (an $SiO_2$ film) having a film thickness of approximately 8 nm. The first conductor film 24m is to be patterned into a floating gate electrode 24 serving as an electric charge storage layer, and the second conductor film 28m is to be patterned into a part of the control gate electrode 28. As the first and second conductor films 24m and 28m, it can be used, e.g., polysilicon doped with a high concentration of phosphorous (P) or boron (B). As the inter-polysilicon insulator 26, it can be used, e.g., a so-called ONO film which has a laminated structure consisting of an $SiO_2$ film, a silicon nitride film ($Si_3N_4$ film) and an $SiO_2$ film, each film thickness falling within a range of 3 nm to 10 nm. The first insulator 30 serves as a mask when patterning the memory cell gate electrode 22, and $Si_3N_4$ film can be used as the film, for example. Here, before depositing the second conductor film 28m, a part of a region of the inter-polysilicon insulator 26 at which the gate electrode of the selecting transistor STD or STS is being formed is removed to provide the connecting portion 27 so that the floating gate electrode 24 and the control gate electrode 28 are to be connected with each other.

(2) Next, the gate electrode is being patterned and then a source/drain region is being formed between the gate electrodes.

Figure 3B:
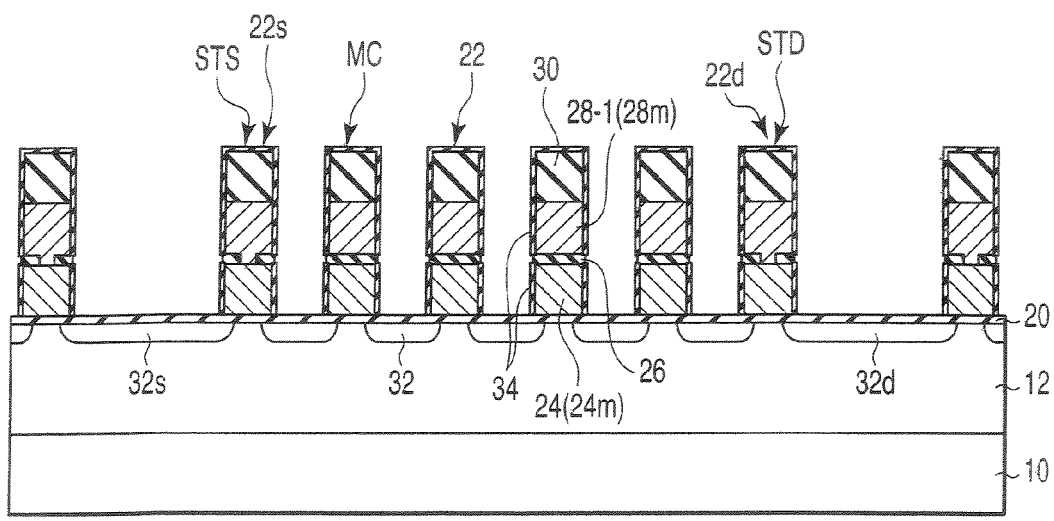

Referring to FIG. 3B, the first insulator 30 is processed into a pattern of a gate electrode by lithography and etching. Subsequently, etching is performed with the first insulator 30 being used as a mask, and thus the second conductor film 28m, the inter-polysilicon insulator 26 and the first conductor film 24m are etched in a self-aligned manner with respect to the first insulator 30 to form a gate electrode 22 of the memory cell transistor MC, a gate electrode 22d of the drain side selecting transistor STD and a gate electrode 22s of the source side selecting transistor STS. The gate insulator 20 on the surface of the silicon substrate 10 between the gate electrodes 22, 22d and 22s is exposed by this etching. In this manner, the first conductor film 24m is patterned into the floating gate electrode 24 serving as the electric charge storage layer, and the second conductor film 28m is patterned into the first conductor layer 28-1 which becomes a part of the control gate electrode 28.

Moreover, post-oxidation is carried out to recover an etching damage given to the surfaces the gate electrodes 22, 22d and 22s during gate electrode patterning, and a post-oxide film 34 is formed on the surfaces of the gate electrodes 22, 22d and 22s having the laminated structure.

Then, a dopant is doped into the silicon substrate 10 between the gate electrodes 22, 22d and 22s by, e.g., ion implantation with the gate electrodes 22, 22d and 22s being used as masks, thereby a forming source/drain region 32, and contact regions 32d and 32s. The contact region 32d is a diffused bit line contact and the contact region 32s is a diffused source line contact, respectively. As the dopant to be doped, it can be used, e.g., arsenic (As) or phosphorous (P) which is of an n-type in this example. However, in a case where the well 12 is of the n-type, it can be used a p-type dopant, e.g., boron (B).

The drain side selecting transistor STD, the memory cell transistor MC and the source side transistor STS in the memory cell array can be electrically connected with each other through the source/drain regions 32.

It is to be noted that the ion implantation for forming the source/drain region can be performed either after post-oxidation as described above or before post-oxidation.

(3) Then, a second insulator is being formed between the memory cell gate electrodes.

Figure 3C:
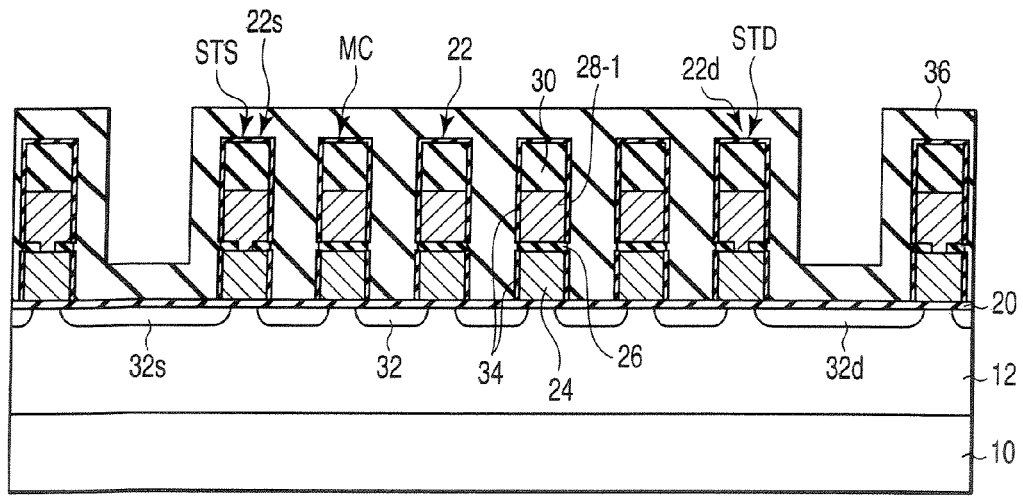

Referring to FIG. 3C, a second insulator 36 is deposited on an entire surface. A thickness of the second insulator 36 is determined so as to completely fill a space between the memory cell gate electrodes 22 but not to completely fill a contact region in which the diffused bit line and source line contacts 32d and 32s are to be formed. Specifically, the second insulator 36 is deposited to a thickness thicker than ½ of a distance between the memory cell gate electrodes 22 but thinner than ½ of a width of each of the diffused contact regions 32d and 32s. As the second insulator 36, it can be used, e.g., a tetraethylorthosilicate (TEOS)—$SiO_2$ film or a low-dielectric-constant insulator. It is to be noted that the second insulator 36 can be formed by sequentially depositing silicon oxide films having different film qualities more than once.

(4) Then, the second insulator 36 is being etched back.

Figure 3D:
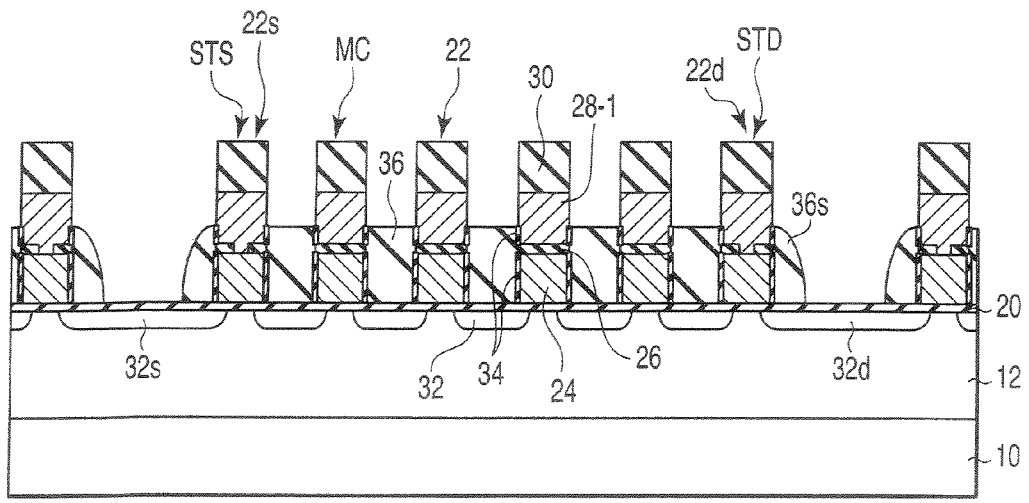

Referring to FIG. 3D, the second insulator 36 is etched by anisotropic etching so that it is etched back to a level of side surfaces of the control gate electrode. A surface level of the etched second insulator 36 is preferably lower than a boundary between the first conductor layer 28-1 and the first insulator 30 but higher than a boundary between the first conductor layer 28-1 and the inter-polysilicon insulator 26. In the etching process, a sidewall insulator 36s is formed on one side surface of the gate electrodes 22d and 22s of the drain side and source side selecting transistor STD and STS in the contact region.

Additionally, the post-oxide film 34 formed on the side surfaces of the gate electrode 22 above the second insulator 36 is also etched off so that the side surfaces of the first conductor layer 28-1 are exposed.

(5) Then, a third insulator which is a hydrogen barrier insulator is being formed on the second insulator, and an entire surface is planarized by the fourth insulator.

Figure 3E:
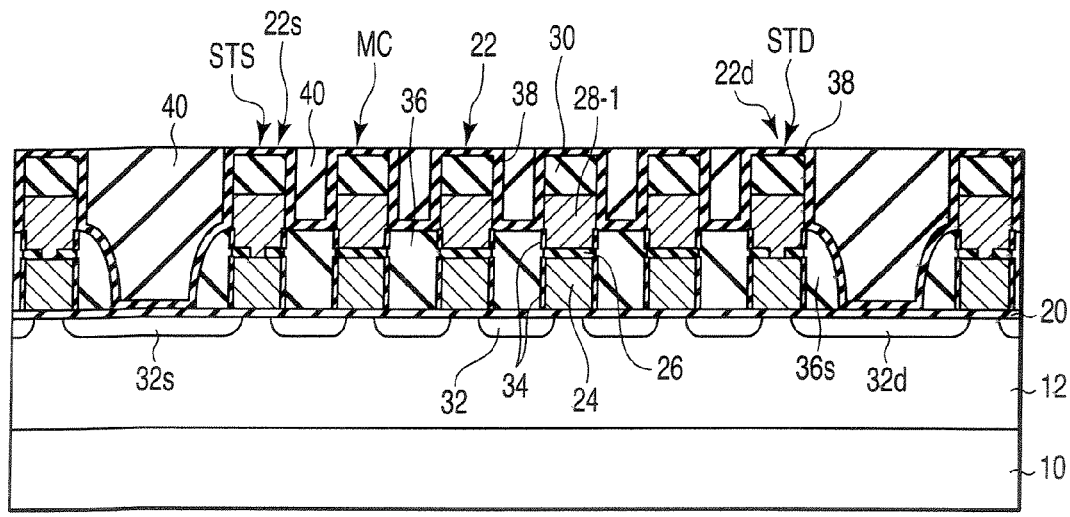

Referring to FIG. 3E, a third insulator 38 is formed on the second insulator 36 and to cover the exposed gate electrodes 22, 22d and 22s. The third insulator 38 has an etching rate different from that of the second insulator 36 and is an insulator having hydrogen barrier properties, and, for example, $Si_3N_4$ film can be used as the film. The third insulator 38 directly comes into contact with the side surface of the second conductor film 28-1 at the part exposed in the previous step. Therefore, as shown in FIG. 3E, the third insulator 38 is formed into a U-like shape between the memory cell gate electrodes 22. Here, before forming the third insulator 38, a very thin native oxide film could be formed on the side surfaces of the second conductor film 28-1, but it can be ignored in relation to penetration of hydrogen into the memory cell gate electrode 22. Therefore, it can be considered that the third insulator 38 substantially contact directly with the second conductor film 28-1 in this case.

Then, a fourth insulator 40 is thickly deposited on an entire surface so that each space between the gate electrodes 22 is filled with the fourth insulator 40. For the fourth insulator 40, it is preferable to use an insulator suitable for planarizing a deep and wide groove, and boro-phospho-silicate glass (BPSG) can be used, for example. The fourth insulator 40 deposited above the gate electrode 22 is removed and planarized by, e.g., chemical mechanical polishing (CMP) with the third insulator 38 being used as a stopper. Here, CMP can be also performed with the first insulator 30 being used as a stopper.

(6) Then, a silicide layer is being formed in an upper part of the gate electrode 22 as a second conductor layer.

Figure 3F:
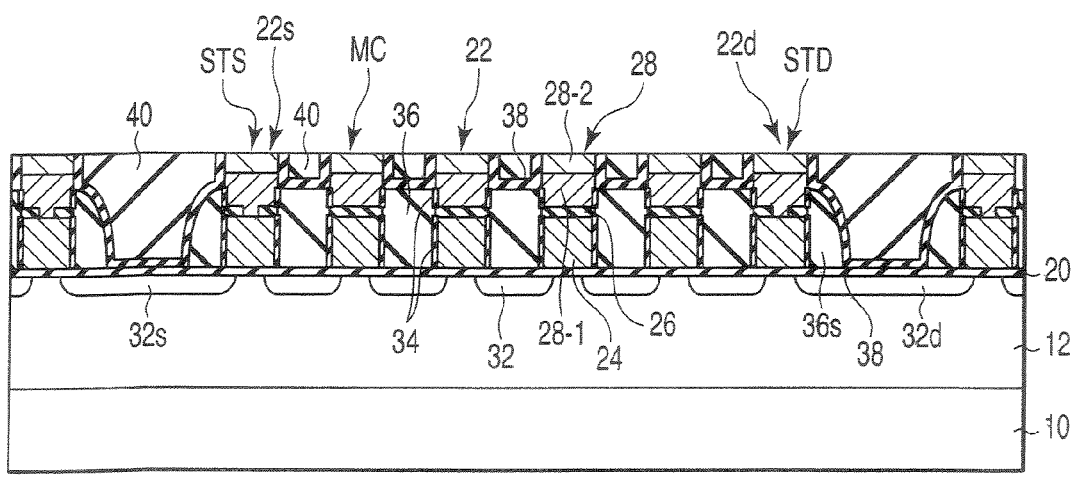

Referring to FIG. 3F, the first and third insulators 30 and 38 on the gate electrodes 22, 22d and 22s are removed by etching. If each of the first and third insulators 30 and 38 are formed of the same material, e.g., $Si_3N_4$, these films can be simultaneously removed. During the etching, the fourth insulator 40 between the gate electrodes 22 is partially left at least. In FIG. 3F, although an entire surface including a surface of the fourth insulator 40 is depicted in flat, there is no problem even if the fourth insulator 40 is formed not being entirely flat. By performing etching in this manner, the third insulator 38 as the hydrogen barrier insulator is removed from the upper surface of the gate electrode 22 and thereby left in the U-like shape between the gate electrodes 22. In this manner, the first conductor layer 28-1, i.e., polysilicon, on the upper surface of each gate electrode 22 can be exposed.

Then, a silicide metal (not shown) is deposited on an entire surface. As the silicide metal, it can be used a metal to form a silicide layer having a lower resistivity, e.g., cobalt (Co), nickel (Ni), platinum (Pt), titanium (Ti), tantalum (Ta) or others. Moreover, tungsten (W) can be also utilized. Subsequently, a heat treatment is carried out to react the silicide metal with silicon, thereby forming a second conductor layer 28-2 of a silicide. Thereafter, unreacted silicide metal is removed. In this manner, it can be formed a control gate electrode 28 having a laminated structure of the first conductor layer 28-1 and the second conductor layer 28-2, i.e., silicide layer. If the second conductor layer 28-2 is formed of, e.g., cobalt silicide (CoSi), a reduction in a resistivity of the control gate electrode 28 can be realized.

(7) Then, a contact electrode and a first wiring are being formed.

Figure 3G:
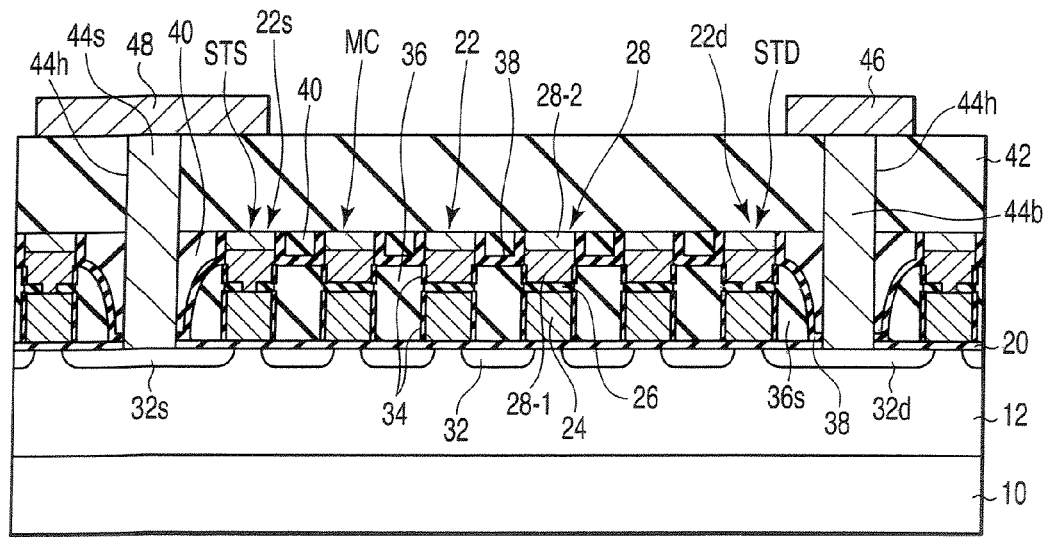

Referring to FIG. 3G, a first interlayer insulator 42 is deposited on an entire surface, and the surface is planarized if necessary. Then, a contact hole 44h reaching the diffused bit line contact 32d or the diffused source line contact 32s is formed in the first interlayer insulator 42. In regard to etching to form the contact hole 44h, the first interlayer insulator 42 and the fourth insulator 40 are sequentially etched with the third insulator 38 being used as an etching stopper. In this manner, by using the third insulator 38 as the etching stopper, the isolation insulator can be prevented from being unnecessarily etched even if the contact hole 44h is misaligned. Then, the third insulator 38 and the gate insulator 20 are sequentially etched to expose the diffused bit line contact 32d and the diffused source line contact 32s.

Subsequently, each contact hole 44h is filled with a contact electrode metal. As the contact electrode metal, it can be used, e.g., a metal, such as aluminum (Al) or tungsten (W), or a semiconductor having a low resistivity. In this manner, a bit line contact electrode 44b connected with the diffused bit line contact 32d and a source line contact electrode 44s connected with the diffused source line contact 32s can be formed. Thereafter, a first wiring metal is deposited on the first interlayer insulator 42 and then patterned. As a result, a bit line connection pad 46 connected with the bit line contact electrode 44b and a first wiring (the source line) 48 connected with the source line contact electrode 44s can be formed. As the first wiring metal, the material used for the contact electrode metal can be used.

(8) Then, a second wiring is being formed.

Figure 3H:
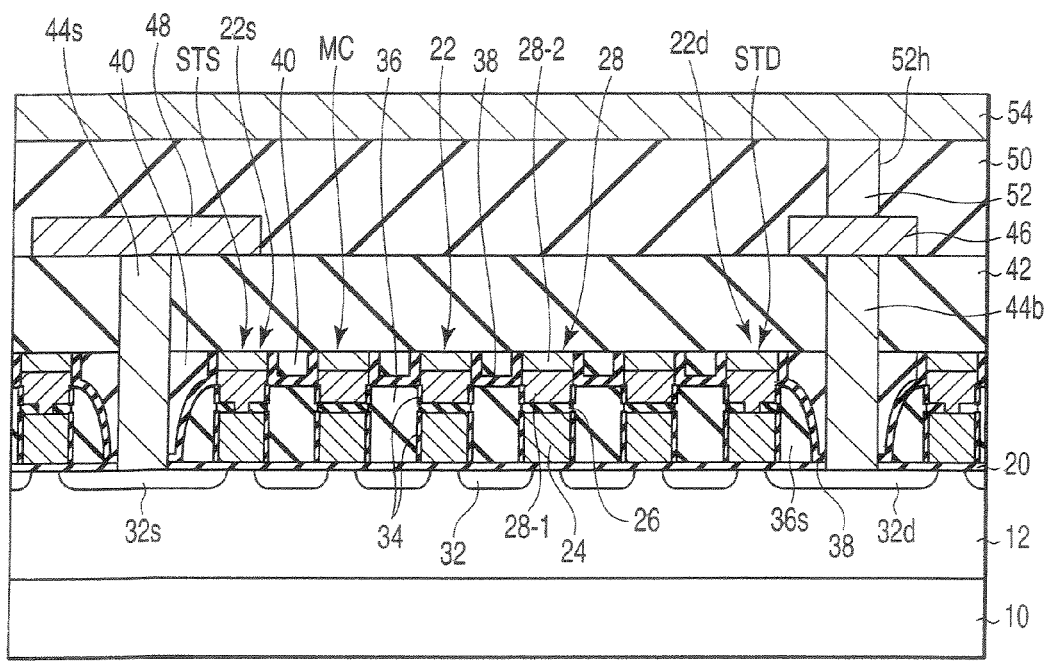

Referring to FIG. 3H, a second interlayer insulator 50 is deposited on an entire surface of the first interlayer insulator 42, the bit line connection pad 46 and the first wiring 48. A second contact hole 52h reaching the bit line connection pad 46 is formed in the second interlayer insulator 50. The second contact hole 52h is filled with the contact electrode metal, thereby forming an inter-wiring contact electrode 52. Furthermore, a second wiring metal is deposited on an entire surface and patterned. As a result, a second wiring (a bit line) 54 connected with the inter-wiring contact electrode 52 can be formed. In this manner, the second wiring (the bit line) 54 is connected with the diffused bit line contact 32d through the inter-wiring contact electrode 52, the bit line connection pad 46 and the bit line contact electrode 44b.

Then, processes required for the semiconductor device, e.g., multilayer wiring, are carried out, thereby a NAND type semiconductor storage device according to the embodiment is completed.

Although the NAND type memory cell array according to the embodiment is shown to have a configuration in which the four memory cell transistors MC are disposed between the selecting transistors STD and STS, the number of the memory cell transistors MC is not limited to four, and the memory cell array can be realized by using any number, e.g., 16 or 32, of the memory cell transistors MC.

In the embodiment, the third insulator 38 serving as the hydrogen barrier insulator is not left on the upper surface of the gate electrode 22 but formed only between the memory cell gate electrodes 22 in the U-like shape, and both side surfaces of the third insulator 38 are in contact with the side surfaces of respective gate electrode 22. As a result, hydrogen can be prevented from being diffused into the gate insulator 20 through the silicon oxide films, e.g., the interlayer insulator 42, 50, formed above the upper surface of the memory cell gate electrode 22. Therefore, it can be avoided deterioration in characteristics of the memory cell transistor MC, e.g., a fluctuation in a threshold voltage or a reduction in a breakdown voltage of the gate insulator due to penetration of hydrogen.

Since the third insulator 38 is not provided on the upper surface of the memory cell gate electrode 22, the third insulator 38 can be formed before forming the second conductor layer, i.e., the silicide layer 28-2 in an upper part of the gate electrode 22. Thereby, a thermal process after forming the silicide layer 28-2 can be reduced. Consequently, as the second conductor layer 28-2, it can be used a silicide, which has a low resistivity but is apt to be affected by a heat treatment at a high temperature, e.g., cobalt silicide (CoSi). Therefore, a resistivity of the control gate electrode 28 serving as the word line can be lowered, and deterioration of the semiconductor device due to a wiring delay of the control gate electrode 28 can be reduced.

Furthermore, the third insulator 38 is formed on the second insulator 36 between the memory cell gate electrodes 22 and does not contact with the inter-polysilicon insulator 26. As a result, even if electrons are trapped in the third insulator 38, it can be avoided deterioration in characteristics such as a fluctuation in a threshold voltage of the memory cell transistor MC caused by, e.g., trapping of electrons in the inter-polysilicon insulator.

Moreover, the third insulator 38 serves as not only the hydrogen barrier insulator for the memory cell gate electrode 22 but also an etching stopper when forming the contact hole 44h by etching. As a result, the contact hole 44h can be formed more easily, thereby increasing a process margin.

As described above, according to the embodiment, degradation of electrical characteristics of the semiconductor device can be avoided, and a process margin can be also improved. Therefore, according to the present invention, it can be provided the semiconductor device, which can achieve both a reduction in resistivity of the gate electrode and stabilization of characteristics of the transistor thereby achieving a higher reliability and higher speed operation, and the manufacturing method thereof.

The embodiment is not limited to the above-described example, and can be modified in many ways. Some of modifications of the embodiment will now be described with reference to cross-sectional views of a memory cell array in a bit line direction shown in FIGS. 4 to 9, but the embodiment is not limited to these modifications.

(First Modification)

Figure 4:
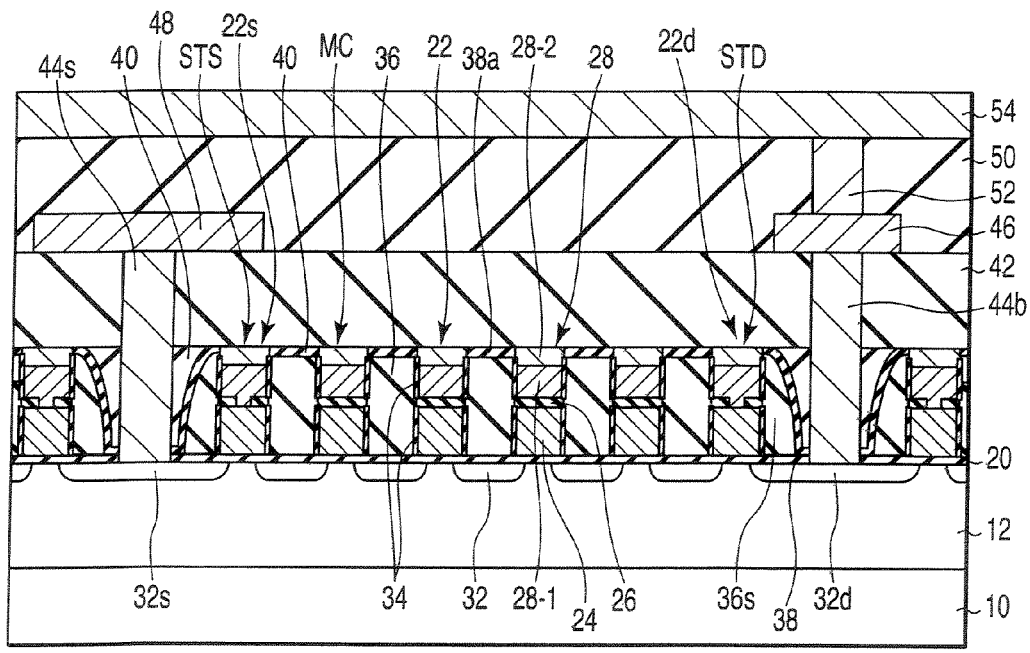
FIG. 4 is a cross-sectional view illustrating an example of a semiconductor device according to a first modification of the present invention.

FIG. 4 shows a cross-sectional view along a bit line direction of a semiconductor device according to a first modification of the embodiment. The first modification is a non-volatile semiconductor storage device in which a third insulator 38a as a hydrogen barrier insulator is formed at a level substantially equal to that of a memory cell gate electrode 22.

In the modification, an etching amount of a second insulator 36 is decreased, and the third insulator 38a is formed at a level substantially equal to a level of the memory cell gate electrode 22. That is, the third insulator 38a is formed between the gate electrodes 22 at a level substantially equal to a level of a lower surface of a first insulator 30, which is used as a mask material for the gate electrode 22 patterning. In order to prevent the third insulator 38a from being removed during etching of the first insulator 30, a fourth insulator 40 is to be etched not to expose the third insulator 38a. In the modification, the third insulator 38a comes into contact with the gate electrode 22 only with side surfaces of a second conductor layer (a silicide layer) 28-2 in the gate electrode 22.

According to the modification, since the third insulator 38a is substantially formed flat between the gate electrodes 22, an amount of the third insulator 38a between the gate electrodes 28 can be reduced. The third insulator 38a is formed of, e.g., $Si_3N_4$ film, and its relative dielectric constant is higher than that of $SiO_2$ film. Therefore, reducing the amount of the third insulator 38a between the control gate electrodes 28 can decrease a parasitic capacitance between the control gate electrodes 28. As a result, an increase in an inter-wiring capacitance can be suppressed, thereby reducing deterioration of a wiring delay.

Additionally, since the third insulator 38a is not provided on an upper surface of the memory cell gate electrode 22, the third insulator 38a can be formed before forming the second conductor layer (the silicide layer) 28-2 in an upper part of the gate electrode 22. As a result, a thermal process after forming the silicide layer 28-2 can be reduced. Consequently, as the second conductor layer 28-2, it can be used a material having a low resistivity, e.g., CoSi. Therefore, a resistivity of the control gate electrode 28 can be lowered, thereby reducing deterioration of the semiconductor device due to a wiring delay of the control gate electrode 28.

(Second Modification)

Figure 5:
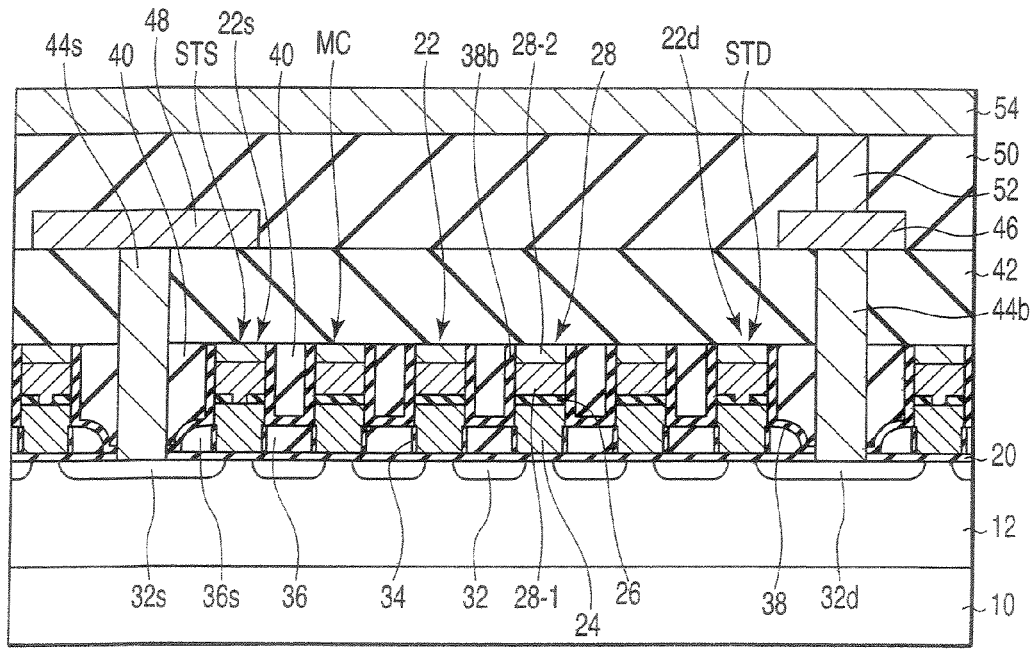
FIG. 5 is a cross-sectional view illustrating an example of a semiconductor device according to a second modification of the present invention.

FIG. 5 is a cross-sectional view along a bit line direction of a semiconductor device according to a second modification of the embodiment. The second modification is a non-volatile semiconductor storage device in which a third insulator 38b is formed into a deep U-like shape to come into contact with side surfaces of an electric charge storage layer 24, i.e., a floating gate electrode and a control gate electrode 28.

In the modification, an etching amount of a second insulator 36 is increased, and the second insulator 36 is left at a level lower than an upper surface of the electric charge storage layer 24. The third insulator 38b is formed on the second insulator 36, thereby manufacturing a semiconductor device according to the modification.

The third insulator 38b according to the modification has a deep U-like shape, and is in contact with side faces of a memory cell gate electrode 22 with a part of the electric charge storage layer (the floating gate electrode) 24 and an entire control gate electrode 28. Therefore, it can be effectively prevented hydrogen from penetrating into the gate electrode 22 from the outside thereof through an interlayer insulator formed above it.

Further, since the third insulator 38b is not provided on the upper surface of the memory cell gate electrode 22, the third insulator 38b can be formed before forming a second conductor layer 28-2, i.e., a silicide layer in an upper part of the gate electrode 22. As a result, a thermal process after forming the second conductor layer 28-2 can be reduced, and a material having a low resistivity, e.g., CoSi, can be used as the second conductor layer 28-2. Therefore, a resistivity of the control gate electrode 28 can be lowered, thereby reducing deterioration of the semiconductor device due to a wiring delay of the control gate electrode 28.

(Third Modification)

Figure 6:
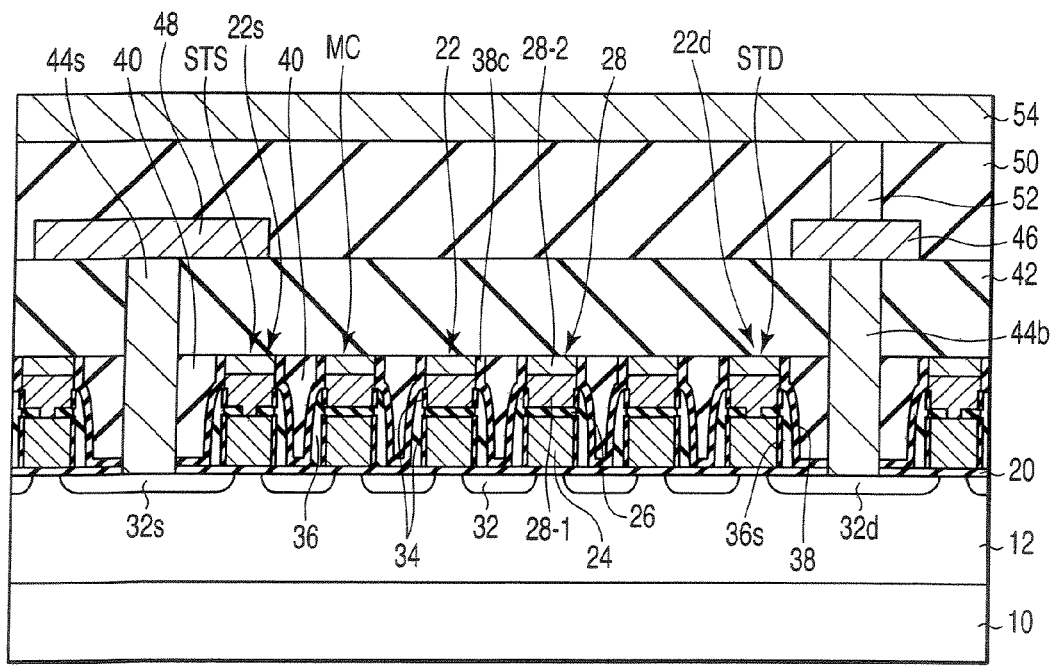
FIG. 6 is a cross-sectional view illustrating an example of a semiconductor device according to a third modification of the present invention.

FIG. 6 is a cross-sectional view along a bit line direction of a semiconductor device according to a third modification of the embodiment. The third modification is a non-volatile semiconductor storage device in which a space between memory cell gate electrodes 22 is not completely filled with a second insulator 36 and the second insulator 36 is formed like a sidewall of the gate electrode 22. The second insulator 36 is formed to expose upper parts of the side surfaces of the gate electrode 22.

In the modification, the second insulator 36 is formed thin. Therefore, the second insulator 36 can be formed under conditions at a higher formation temperature and/or a lower formation speed as compared with the first embodiment and the first and second modifications in which the spaces between the gate electrodes 22 are filled with the second insulator 36. The second insulator 36 formed under such conditions has a better quality, and an electric charge trap site in the insulator can be reduced, for example. Therefore, it can be suppressed deterioration of characteristics of the memory cell transistor due to electric charge trapped in the second insulator 36.

Furthermore, a third insulator 38c is formed from a silicon substrate 10 to a top of side surfaces of the gate electrode 22 to cover the second insulator 36. The third insulator 38c comes into contact with an upper part of side surfaces of a control gate electrode 28. Therefore, it can be effectively prevented hydrogen from penetrating into the gate electrode 22 from the outside thereof through an interlayer insulator formed above it.

In the modification, since the third insulator 38c is not formed on the upper surface of the memory cell gate electrode 22, the third insulator 38c can be formed before forming the second conductor layer 28-2, i.e., the silicide layer in an upper part of the gate electrode 22. As a result, a thermal process after forming the second conductor layer 28-2 can be reduced, and a material having a low resistivity, e.g., CoSi, can be used as the second conductor layer 28-2. Therefore, a resistivity of the control gate electrode 28 can be lowered, thereby reducing deterioration of the semiconductor device due to a wiring delay of the control gate electrode 28.

In FIG. 6, it is shown that the third insulator 38c is in contact with a gate insulator 20 at a bottom portion between the gate electrodes 22. However, it can be adopted a configuration in which the second insulator 36 is left between the third insulator 38c and the gate insulator 20 or a configuration in which the gate insulator 20 is removed and the third insulator 38c is in contact with the silicon substrate 10.

(Fourth Modification)

Figure 7:
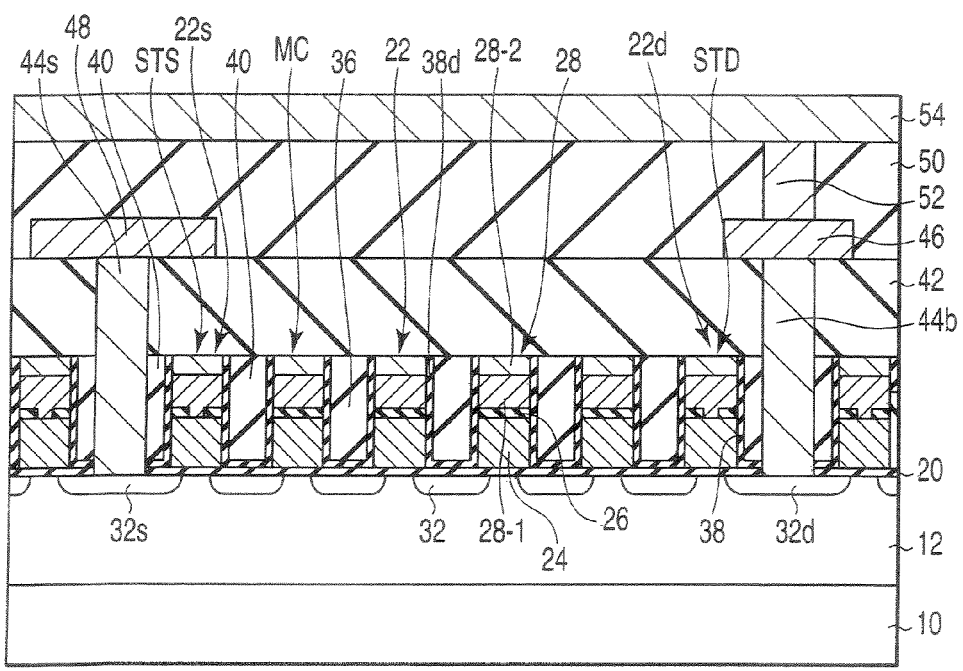
FIG. 7 is a cross-sectional view illustrating an example of a semiconductor device according to a fourth modification of the present invention.

FIG. 7 is a cross-sectional view along a bit line direction of a semiconductor device according to a fourth modification of the embodiment. The fourth modification is a non-volatile semiconductor storage device in which a post-oxide film and a second insulator are not provided between gate electrodes 22 and a third insulator 38d is in contact with entire side surfaces of the gate electrode 22 of a memory cell transistor.

In the modification, after patterning the gate electrode 22, the post-oxide film is not formed, or the post-oxide film is formed and then removed. Moreover, the third insulator 38d is formed without forming the second insulator so that the third insulator 38d is in contact with entire side surfaces of the gate electrode 22. Therefore, it can be effectively prevented hydrogen from penetrating into the gate electrode 22 from the outside thereof through an interlayer insulator formed above it.

Additionally, since the third insulator 38d is not formed on the upper surface of the memory cell gate electrode 22, the third insulator 38d can be formed before forming a second conductor layer 28-2, i.e., a silicide layer in an upper part of the gate electrode 22. As a result, a thermal process after forming the second conductor layer 28-2 can be reduced, and a material having a low resistivity, e.g., CoSi, can be used as the second conductor layer 28-2.

In the modification, since the second insulator 36 can be formed thin, the manufacturing process can be simplified, which contributes to a reduction in a manufacturing cost.

In FIG. 7, it is shown that the third insulator 38d is in contact with a gate insulator 20 at a bottom portion between the memory cell gate electrodes 22. However, it can be adopted a configuration in which the gate insulator 20 is removed from the bottom portion between the memory cell gate electrodes 22 and the third insulator 38d is in contact with a silicon substrate 10.

(Fifth Modification)

Figure 8:
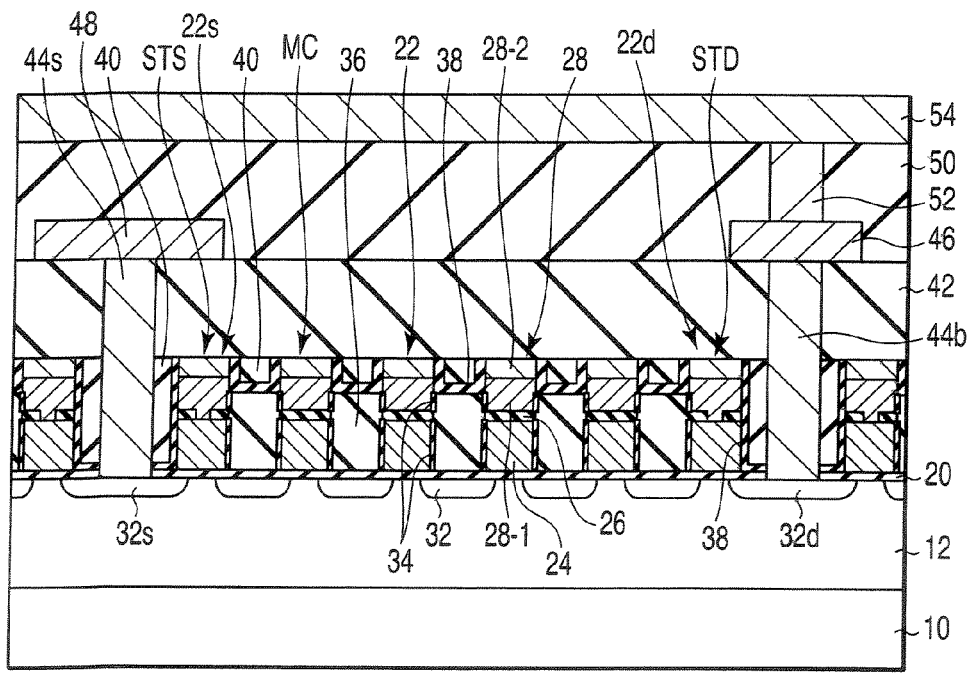
FIG. 8 is a cross-sectional view illustrating an example of a semiconductor device according to a fifth modification of the present invention.

FIG. 8 is a cross-sectional view along a bit line direction of a semiconductor device according to a fifth modification of the embodiment. The fifth modification is a non-volatile semiconductor storage device in which a second insulator 36 is removed from diffused contact regions 32d and 32s of a drain side selecting transistor STD and a source side selecting transistor STS disposed at each end of a memory cell array.

According to the modification, distances between respective gate electrodes 22d and 22s of the drain side and source side selecting transistors STD and STS and corresponding contact electrodes 44b and 44s can be reduced, respectively. Therefore, high integration of the semiconductor device can be realized, which contributes to a reduction in a manufacturing cost.

In the modification, a third insulator 38 is formed into a U-like shape between the gate electrodes 22 like the first embodiment and it is in contact with side surfaces of an upper part of the gate electrode 22. Therefore, it can be effectively prevented hydrogen from penetrating into the gate electrode 22 from the outside thereof through an interlayer insulator formed above it.

Additionally, since the third insulator 38 is not formed on the upper surface of the memory cell gate electrode 22, the third insulator 38 can be formed before forming the second conductor layer 28-2, i.e., the silicide layer in an upper part of the gate electrode 22. As a result, a thermal process after forming the second conductor layer 28-2 can be reduced, and a material having a low resistivity, e.g., CoSi, can be used as the second conductor layer 28-2.

(Sixth Modification)

Figure 9:
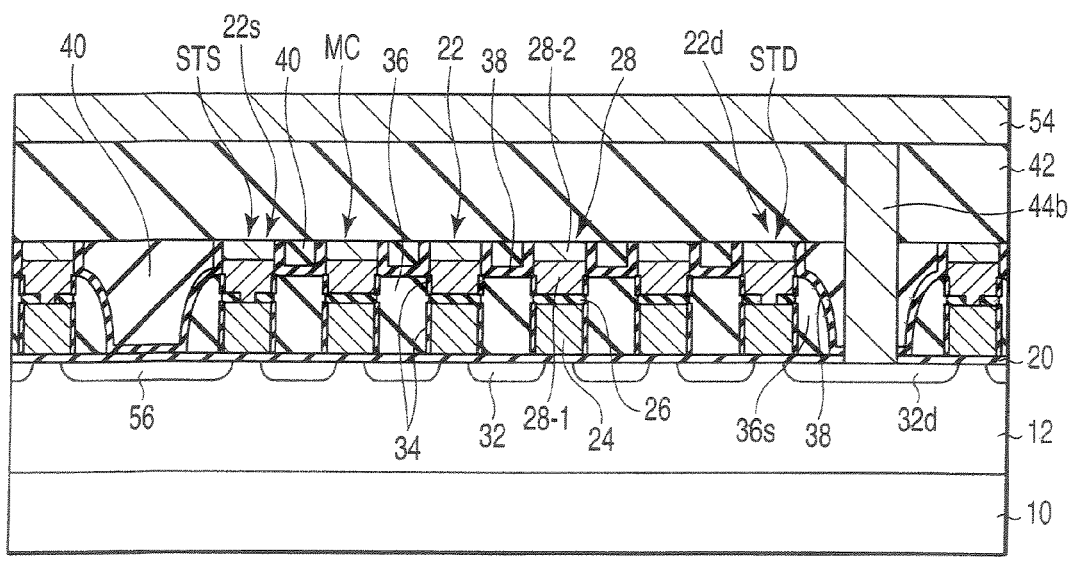
FIG. 9 is a cross-sectional view illustrating an example of a semiconductor device according to a sixth modification of the present invention.

FIG. 9 is a cross-sectional view along a bit line direction of a semiconductor device according to a sixth modification of the embodiment. The sixth modification is a non-volatile semiconductor storage device in which a source line 56 is formed in a silicon substrate 10 using a diffused layer.

In the modification, when forming isolation, the isolation is formed to be separated in a region where a source line diffused layer 56 is formed so that a source line is to be formed. In such a structure, after patterning a gate electrode 22, a silicon substrate 10 can be exposed in a region where the source line is being formed. Thereafter, like the source/drain region 32, dopants are doped, thereby forming the source line by using the diffused layer 56. It is to be noted that a dopant concentration in the source line diffused layer 56 can be increased as compared with that in the source/drain region 32 between the gate electrodes 22.

In the modification, since a wiring step can be simplified, it can contribute to a reduction in a manufacturing cost.

In the modification, the third insulator 38 is formed into a U-like shape between the gate electrodes 22 like the first embodiment, and it is in contact with side surfaces of an upper part of the gate electrode 22. Therefore, it can be effectively prevented hydrogen from penetrating into the gate electrode 22 from the outside thereof through an interlayer insulator formed above it.

Further, since the third insulator 38 is not formed on the upper surface of the memory cell gate electrode 22, the third insulator 38 can be formed before forming the second conductor layer 28-2, i.e., the silicide layer in an upper part of the gate electrode 22. As a result, a thermal process after forming the second conductor layer 28-2 can be reduced, and a material having a low resistivity, e.g., CoSi, can be used as the second conductor layer 28-2.

Second Embodiment

The present invention can be applied to not only the NAND type non-volatile semiconductor storage device but also any other semiconductor storage device.

Figure 10:
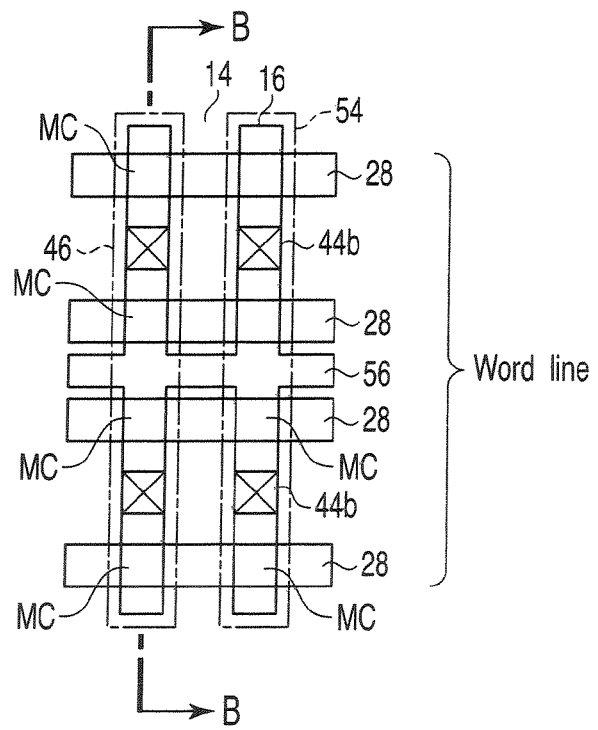
FIG. 10 is a plan view illustrating an example of a semiconductor device according to a second embodiment of the present invention.
Figure 11:
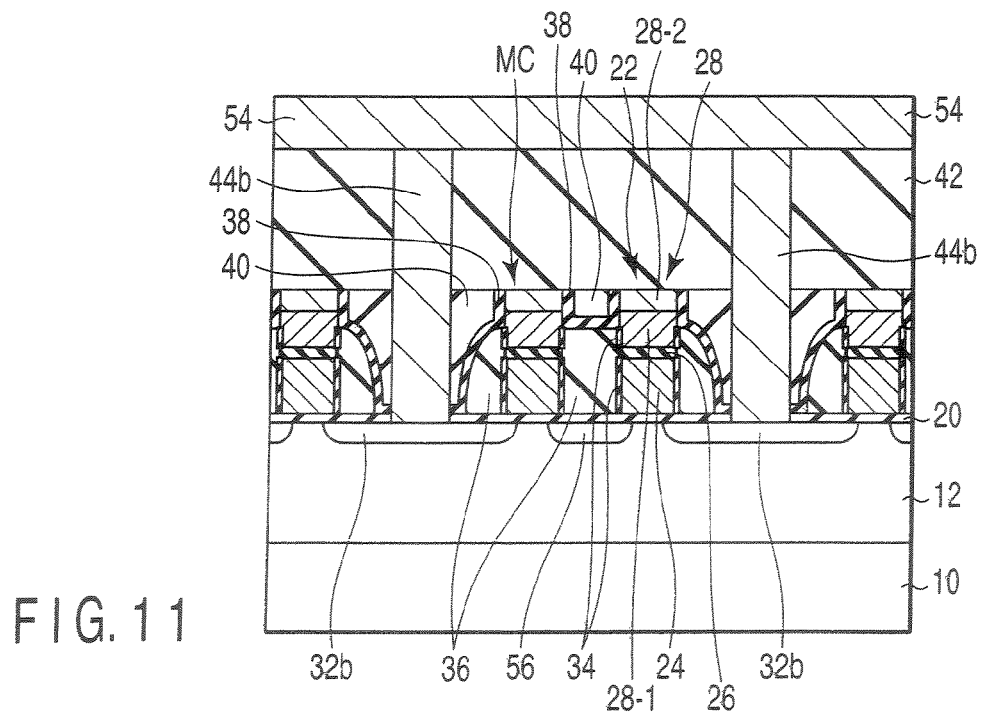
FIG. 11 is a cross-sectional view in a bit line direction illustrating an example of the semiconductor device according to the second embodiment of the present invention taken along a cutting-plane line B-B in FIG. 10.

A second embodiment is an NOR type non-volatile semiconductor storage device according to the present invention, and will now be described with reference to FIGS. 10 and 11. FIG. 10 is a plan view schematically showing a configuration of the NOR type non-volatile semiconductor storage device according to the embodiment. FIG. 11 is a cross-sectional view in a bit line direction taken along a cutting-plane line B-B in FIG. 10.

The NOR type non-volatile semiconductor storage device according to the embodiment comprises two memory cell transistors MC between bit line contact electrodes 44b, but does not include a selecting transistor such as one in the NAND type non-volatile semiconductor storage device. A source line 56 is formed by a diffused layer in a silicon substrate 10 between the two memory cell transistors MC.

A configuration of a memory cell gate electrode 22 is the same as that in the first embodiment, and the electrode 22 includes an electric charge storage layer 24, i.e., a floating gate electrode, which is formed on a gate insulator 20, an inter-polysilicon insulator 26 formed on the electric charge storage layer 24, and a control gate electrode 28 formed on the inter-polysilicon insulator 26. The control gate electrode 28 may have a laminated structure of first and second conductor layers 28-1 and 28-2, e.g., a polysilicon layer 28-1 and a silicide layer 28-2, such as cobalt silicide. The control gate electrode 28 connects with another memory cell MC adjacent in a lateral direction in FIG. 10, and thereby serves as a word line.

Further, diffused bit line contacts 32b are formed at both ends of the two memory cells, and a source line diffused layer 56 is formed between the two memory cells.

A part of a side surface of the memory cell gate electrode 22 is covered with a post-oxide film 34. A second insulator 36 consisting of, e.g., a silicon oxide is formed over the post-oxide film 34 and a gate insulator 20. A third insulator 38 as a hydrogen barrier insulator is formed on the second insulator 36. The third insulator 38 is formed into a U-like shape between the memory cell gate electrodes 22, and both side surfaces of the third insulator 38 are in contact with upper side surfaces of the gate electrodes 22. A fourth insulator 40 is formed on the third insulator 38, and then an entire surface is planarized. An upper part of the control gate electrode 28 is silicided, thereby forming a second conductor layer 28-2. As the second conductor layer, it can be used a material, e.g., cobalt silicide (CoSi), which has a low resistivity. A first interlayer insulator 42 is provided on the fourth insulator 40 and the control gate electrode 28. A bit line contact electrode 44b connected with a diffused bit line contact 32b is formed in the first interlayer insulator 42 and the fourth insulator 40, and a bit line 54 connected with the bit line contact electrode 44b is formed on the first interlayer insulator 42.

In the embodiment, the third insulator 38 is also formed into a U-like shape between the gate electrodes 22 like the first embodiment, and it is in contact with side surfaces of upper parts of the gate electrodes 22. Therefore, it can be effectively prevented hydrogen from penetrating into the gate electrode 22 from the outside thereof through the interlayer insulator formed above it.

Further, since the third insulator 38 is not formed on the upper surface of the memory cell gate electrode 22, the third insulator 38 can be formed before forming the second conductor layer 28-2, i.e., the silicide layer in an upper part of the gate electrode 22. As a result, a thermal process after forming the second conductor layer 28-2 can be reduced. Consequently, as the second conductor layer 28-2, it can be used, e.g., CoSi which has a low resistivity but is not stable in a high temperature treatment. Therefore, a resistivity of the control gate electrode 28 serving as a word line can be reduced, thereby alleviating deterioration of the semiconductor device due to a wiring delay of the control gate electrode 28.

As described above, the present invention can be also applied to the NOR type non-volatile semiconductor storage device.

In the embodiment, the description has been given as to the configuration in which the third insulator 38 is formed into a U-like shape like the first embodiment, but the configuration can be modified and carried out as either one of the first to fifth modifications of the first embodiment described above, and the present invention is not limited thereto.

As described above, the present invention can be applied to not only the NAND type non-volatile semiconductor storage device but also the NOR type non-volatile semiconductor storage device. Furthermore, the present invention can be likewise applied to any other non-volatile semiconductor storage device, such as an AND type and a DiNOR type.

Third Embodiment

The present invention can be applied to not only the floating gate electrode type non-volatile semiconductor storage device but also any other semiconductor storage device. In the embodiments described above, the description has been given as to a memory cell which stores electric charge in the floating gate electrode, the present invention can be also applied to, e.g., an MONOS (metal oxide nitride oxide silicon) type memory cell which stores electric charge in an insulator.

Figure 12:
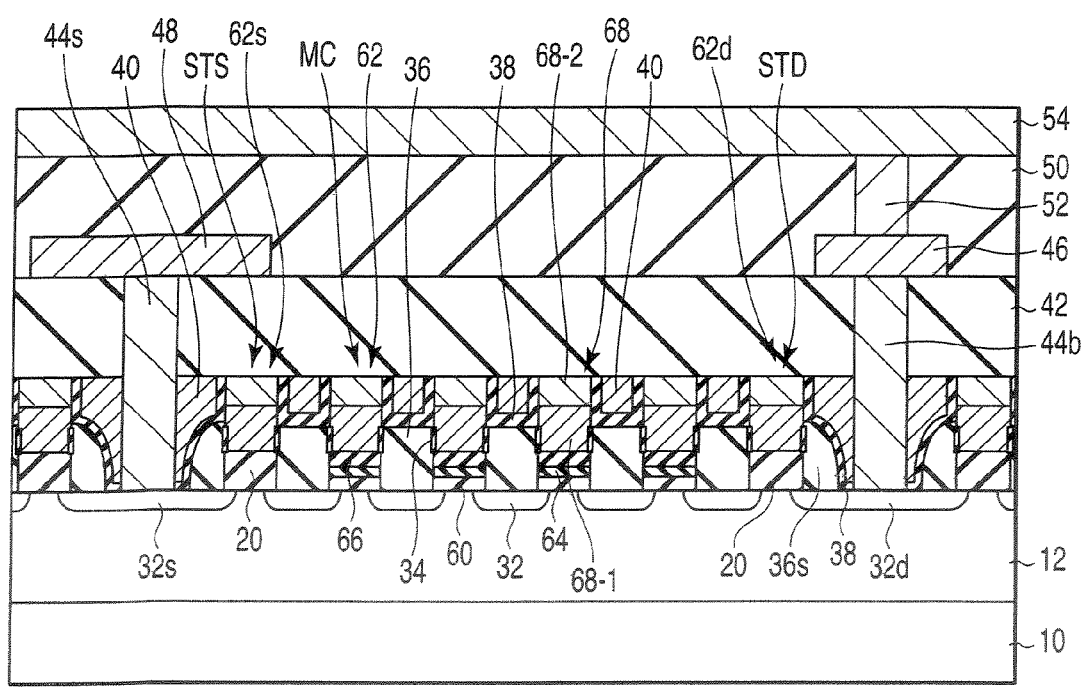
FIG. 12 is a cross-sectional view in a bit line direction illustrating an example of a semiconductor device according to a third embodiment of the present invention.

In the third embodiment according to the present invention, the present invention is applied to an NAND type non-volatile semiconductor storage device in which an MONOS type memory cell is used. FIG. 12 shows an example of a cross-sectional structure of the semiconductor device according to the embodiment. According to the embodiment, a configuration of the MONOS type non-volatile semiconductor storage device is the same as that shown in the plan view of FIG. 1. FIG. 12 is a cross-sectional view of the semiconductor device in a bit line direction taken along a cutting-plane line A-A in FIG. 1.

The MONOS type memory cell is different from the foregoing embodiments and uses an insulator as an electric charge storage layer of a memory cell transistor MC in place of a floating gate electrode. Here, the embodiment will be described while mainly focusing on a difference from the first embodiment.

A memory cell MC according to the embodiment includes a memory cell gate electrode 62 provided on a silicon substrate 10. The memory cell gate electrode 62 includes a fifth insulator 60 formed on the silicon substrate 10, a sixth insulator 64 formed on the fifth insulator 60 and serving as an electric charge storage layer, a seventh insulator 66 formed on the sixth insulator 64, and a control gate electrode 68 formed on the seventh insulator 66. As the fifth insulator 60, it can be used, e.g., $SiO_2$ film. As the sixth insulator 64, it can be used, e.g., $Si_3N_4$ film. As the seventh insulator 66, for example, $SiO_2$ film can be used. The control gate electrode 68 can have a laminated structure of first and second conductor layers 68-1 and 68-2, e.g., a polysilicon layer 68-1 and a silicide layer 68-2 such as cobalt silicide, like the first embodiment. The control gate electrode 68 connects with memory cells MC of other memory cell arrays adjacent in a direction vertical to a page space of FIG. 12, and serves as a word line.

Although gate electrodes 62d and 62s of drain side and source side selecting transistors STD and STS formed at respective ends of the memory cell array have a configuration similar to that of the memory cell gate electrode 62, a gate insulator 20 is formed in place of a laminated film including the fifth insulator 60, the sixth insulator 64 and the seventh insulator 66. As the gate insulator 20, it can be used, e.g., $SiO_2$ film.

Spaces between the gate electrodes 62, 62d and 62s of each memory cell transistor MC and the drain side and source side selecting transistors STD and STS are filled with a second insulator 36 as an inter-electrode insulator. An upper part of the control gate electrode 68 is not buried in the second insulator 36. A third insulator 38 serving as a hydrogen barrier insulator is formed into a U-like shape on the second insulator 36 between the gate electrodes 62. Although the third insulator 38 directly comes into contact with side surfaces of the upper part of the control gate electrode 68, it is not provided on an upper surface of the control gate electrode 68, i.e., on the second conductor layer 68-2.

Any other structure on the gate electrode 62, a wiring configuration and others are substantially similar to those in the first embodiment, thereby omitting their explanation.

With such a configuration, since the third insulator 38 having hydrogen barrier properties can be formed before forming a silicide layer as a second conductor layer 68-2, a high-temperature heat treatment after forming the second conductor layer can be reduced. Therefore, As the second conductor layer 68-2, it can be used a material, for example, CoSi, which has a low resistivity but is not stable in a high temperature treatment. As a result, a wiring delay can be suppressed without increasing a resistivity of the control gate electrode 68. Furthermore, since the third insulator 38 having hydrogen barrier properties is formed in contact with side surfaces of the gate electrode 62, hydrogen can be prevented from being diffused into the fifth insulator 60 through the inter-electrode insulator between the memory cell gate electrodes 62. Accordingly, it can be avoided deterioration in characteristics of the memory cell transistor MC due to penetration of hydrogen.

Therefore, it can be provided the semiconductor device in which degradation in characteristics of the transistor can be avoided and the silicide layer capable of reducing a resistivity is used as the second conductor layer 68-2 in the control gate electrode 68, and a manufacturing method thereof.

As described above, the present invention is also applied to an MONOS type non-volatile semiconductor storage device.

In the embodiment, although the description has been given as to the configuration in which the third insulator 38 is formed into a U-like shape like that of the first embodiment, the third insulator 38 can be formed in flat as explained in conjunction with the first modification of the first embodiment. Moreover, as described with reference to the third modification of the first embodiment, the second insulator 36 can be formed like sidewalls of each gate electrode 62 by not completely filling the space between the memory cell gate electrodes 62 with the second insulator 62. Additionally, as described in conjunction with the fourth modification of the first embodiment, the third insulator 38 can be formed to come into contact with entire side surfaces of each gate electrode 62 of the memory cell transistor, but the present invention is not limited to these examples.

Even in a case where the memory cell has the MONOS type configuration, the present invention can be widely applied to any other non-volatile semiconductor storage devices, e.g., an NOR type, an AND type and a DiNOR type non-volatile semiconductor storage device, as well as the NAND type non-volatile semiconductor storage device, as described in the second embodiment. That is, the present invention can be applied to any semiconductor devices as long as it has a configuration in which a plurality of gate electrodes are connected in series and there is no contact between the gate electrodes. More specifically, the present invention can be advantageously applied to semiconductor devices, such as a non-volatile semiconductor storage device in which a contact electrode is disposed with a small margin with respect to an active region and a high electrical stress is applied to a gate insulator.

Accordingly, it can be achieved by the present invention to reduce a resistivity of the control gate electrode and to prevent hydrogen from diffusing into the gate insulator through the inter-electrode insulator between the memory cell gate electrodes, as well as to improve a process margin of an etching for forming the contact hole on the contact region. As a result, it can be avoided a deterioration in electrical characteristics of the semiconductor device, such as a fluctuation of a threshold voltage of the memory cell transistor, a reduction in a breakdown voltage of the gate insulator, and a wiring delay.

As described above, according to the present invention, electrical characteristics of the semiconductor device can be prevented from being deteriorated, and a process margin can be also improved. Therefore, it can be provided the semiconductor device and the manufacturing method thereof which can achieve both a reduction in a resistivity of the gate electrode and stabilization of characteristics of the transistor and can allow high-speed operation with high reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device, comprising:
   forming an electric charge storage layer on a semiconductor substrate through a first insulator;
   forming a first conductor layer on the electric charge storage layer through a second insulator to form a plurality of gate electrodes;
   depositing a third insulator to cover the plurality of the gate electrodes and on the first insulator;
   removing a part of the third insulator such that a surface level of the third insulator is lower than an upper surface level of the gate electrodes;
   forming a barrier insulator on the third insulator and across a space between the gate electrodes, the barrier insulator being in contact with side surfaces alone of the gate electrodes;
   forming a second conductor layer in an upper part of the first conductor layer; and
   forming an interlayer insulator in contact with an upper surface of the second conductor layer.

2. The manufacturing method of a semiconductor device according to claim 1, wherein the barrier insulator includes a silicon nitride film.

3. The manufacturing method of a semiconductor device according to claim 1, wherein the barrier insulator is formed at a level higher than a level of the second insulator.

4. The manufacturing method of a semiconductor device according to claim 1, wherein the barrier insulator is formed at a level lower than a level of the second insulator.

5. The manufacturing method of a semiconductor device according to claim 1, wherein the barrier insulator is formed in contact with entire side surfaces of the gate electrodes.

6. The manufacturing method of a semiconductor device according to claim 1, wherein the barrier insulator is formed at a level substantially equal to an upper level of the gate electrodes.

7. The manufacturing method of a semiconductor device according to claim 1, wherein the second conductor layer includes one of cobalt silicide, nickel silicide, platinum silicide, titanium silicide and tantalum silicide.

8. A semiconductor device comprising:
   a first insulator provided on a surface of a semiconductor substrate;
   a plurality of gate electrodes each including an electric charge storage layer formed on the first insulator, first and second conductor layers, and a second insulator disposed between the electric charge storage layer and the first conductor layer;
   a third insulator provided on the first insulator and across a space between the gate electrodes, and being in contact with side surfaces of the gate electrodes, a surface level of the third insulator being lower than an upper surface level of the gate electrodes;
   a barrier insulator provided on the third insulator and across a space between the gate electrodes, and being in contact with side surfaces alone of the gate electrodes; and
   an interlayer insulator provided in contact with an upper surface of the second conductor layer.

9. The semiconductor device according to claim 8, wherein the barrier insulator includes a silicon nitride film.

10. The semiconductor device according to claim 8, wherein the barrier insulator contacts with side surfaces of the second conductor layer.

11. The semiconductor device according to claim 8, wherein the barrier insulator is formed at a level substantially equal to an upper level of the gate electrodes.

12. The semiconductor device according to claim 8, wherein the barrier insulator contacts with side surfaces of the electric charge storage layer and the first and second conductor layers.

13. The semiconductor device according to claim 8, wherein the second conductor layer includes one of cobalt silicide, nickel silicide, platinum silicide, titanium silicide and tantalum silicide.

* * * * *